(12) United States Patent
Hill et al.

(10) Patent No.: US 7,369,411 B2
(45) Date of Patent: May 6, 2008

(54) THERMAL INTERFACE ASSEMBLY AND METHOD FOR FORMING A THERMAL INTERFACE BETWEEN A MICROELECTRONIC COMPONENT PACKAGE AND HEAT SINK

(75) Inventors: Richard Hill, Parkman, OH (US); Jason L. Strader, North Olmstead, OH (US)

(73) Assignee: Thermagon, Inc., Cleveland, OH (US)

( * ) Notice: Subject to any disclaimer, the term of this patent is extended or adjusted under 35 U.S.C. 154(b) by 216 days.

(21) Appl. No.: 10/752,614

(22) Filed: Jan. 7, 2004

(65) Prior Publication Data

US 2005/0073816 A1    Apr. 7, 2005

Related U.S. Application Data

(60) Continuation-in-part of application No. 10/090,540, filed on Mar. 1, 2002, now Pat. No. 6,761,928, and a division of application No. 09/513,483, filed on Feb. 25, 2000, now Pat. No. 6,372,997.

(51) Int. Cl.
   *H05K 7/20*    (2006.01)
   *H01L 23/34*   (2006.01)

(52) U.S. Cl. ............ 361/708; 361/707; 361/709; 257/712; 257/713; 257/720; 165/185

(58) Field of Classification Search ........ 361/704–705, 361/707–708, 710, 709; 257/704–705, 712–713, 257/709, 719–720, E23.089, 706; 165/80.2, 165/185; 427/123
See application file for complete search history.

(56) References Cited

U.S. PATENT DOCUMENTS 4,607,277 A * 8/1986 Hassan et al. ............. 257/713
4,915,167 A * 4/1990 Altoz .......................... 165/185
5,097,387 A * 3/1992 Griffith ....................... 361/699
5,561,590 A * 10/1996 Norell et al. ............... 361/699
5,572,404 A * 11/1996 Layton et al. .............. 361/699

(Continued)

FOREIGN PATENT DOCUMENTS

JP    60-100438 A   *   6/1985

(Continued)

OTHER PUBLICATIONS

Frick, John, Woldman's Engineering Alloys, 8th ed, ASM International, 1994, p. 600.*

(Continued)

*Primary Examiner*—Jayprakash Gandhi
*Assistant Examiner*—Robert J. Hoffberg
(74) *Attorney, Agent, or Firm*—Anderson Kill & Olick, PC

(57) ABSTRACT

A thermal interface assembly and method for forming a thermal interface between a microelectronic component package and a heat sink having a total thermal resistance of no greater than about 0.03° C.-in²/W comprising interposing a thermal interface assembly between an microelectronic component package and heat sink with the thermal interface assembly comprising a thermal interface material having phase change properties and a sealing member selected from the group consisting of an o-ring and/or shim in an arrangement such that the thermal interface material is shielded from the atmosphere when the microelectronic component package is operational.

8 Claims, 3 Drawing Sheets

U.S. PATENT DOCUMENTS

| | | | |
|---|---|---|---|
| 5,907,474 A * | 5/1999 | Dolbear | 361/705 |
| 5,909,056 A * | 6/1999 | Mertol | 257/704 |
| 5,936,838 A * | 8/1999 | Lii et al. | 361/705 |
| 6,016,006 A * | 1/2000 | Kolman et al. | 257/712 |
| 6,037,659 A * | 3/2000 | Weixel | 257/717 |
| 6,097,602 A * | 8/2000 | Witchger | 361/705 |
| 6,281,573 B1 * | 8/2001 | Atwood et al. | 257/706 |
| 6,292,362 B1 * | 9/2001 | O'Neal et al. | 361/687 |
| 6,344,633 B1 * | 2/2002 | Furuuchi | 219/517 |
| 6,372,997 B1 * | 4/2002 | Hill et al. | 174/252 |
| 6,665,186 B1 * | 12/2003 | Calmidi et al. | 361/704 |
| 6,835,453 B2 * | 12/2004 | Greenwood et al. | 428/343 |
| 6,849,941 B1 * | 2/2005 | Hill et al. | 257/710 |
| 7,031,162 B2 * | 4/2006 | Arvelo et al. | 361/718 |
| 7,063,127 B2 * | 6/2006 | Gelorme et al. | 165/80.02 |
| 2004/0188829 A1 * | 9/2004 | Hu et al. | 257/712 |
| 2004/0262766 A1 * | 12/2004 | Houle | 257/758 |
| 2005/0252649 A1 * | 11/2005 | Chiu et al. | 165/185 |

FOREIGN PATENT DOCUMENTS

JP  60100456 A * 6/1985

OTHER PUBLICATIONS

English Translation of Yabe, JP 60-100456, Japanese Publication, Jun. 1985.*

* cited by examiner

US 7,369,411 B2

THERMAL INTERFACE ASSEMBLY AND METHOD FOR FORMING A THERMAL INTERFACE BETWEEN A MICROELECTRONIC COMPONENT PACKAGE AND HEAT SINK

FIELD OF INVENTION

This is a Continuation-In-Part of patent application Ser. No. 10/090,540 filed on Mar. 1, 2002 now U.S. Pat. No. 6,761,928 which is in turn a division of U.S. patent application Ser. No. 09/513,483 filed Feb. 25, 2000 now U.S. Pat. No. 6,372,997 and relates to a thermal interface assembly and method for establishing a thermal interface with low contact thermal resistance between a microelectronic component package and a heat sink.

BACKGROUND OF THE INVENTION

Microelectronic components, such as semiconductors, generate substantial heat which must be removed to maintain the component's junction temperature within safe operating limits. Exceeding these limits can change the performance characteristics of the component and/or damage the component. The heat removal process involves heat conduction through an interface material from the microelectronic component to a heat sink. The selection of the interface material and the thermal resistance at the interface between the heat generating component (e.g. silicon ic chip) and the heat sink controls the degree of heat transfer. As the demand for more powerful microelectronics increase so does the need for improved heat removal.

The thermal resistance between the microelectronic component package and the heat sink is dependent not only upon the intrinsic thermal resistance of the interface material but also upon the contact interface thermal resistance formed at the junction between the interface material on each opposite side thereof and the microelectronic component and heat sink respectively. One known way to minimize contact thermal resistance at each interface junction is to apply high pressure to mate the interface material to the microelectronic package and heat sink. However, excessive pressure can create detrimental and undesirable stresses. Accordingly, the application of pressure is generally limited so as not to exceed 100 psi and preferably below about 20 psi.

It is also known to use a thermal grease or paste as the thermal interface material or to use a thin sheet composed of a filled polymer, metallic alloy or other material composition having phase change properties. A material having phase change properties is characterized as having a viscosity responsive to temperature with the material being solid at room temperature and softening to a creamy or liquid consistency as the temperature rises above room temperature. Accordingly, as the microelectronic component heats up the material softens allowing it to flow to fill voids or microscopic irregularities on the contact surface of the microelectronic component and/or heat sink. Excess phase change material is squeezed out allowing the opposing surfaces between the microelectronic component and heat sink to physically come closer together as the phase change material melts thereby reducing the thermal resistance between them.

Since the microelectronic package and heat sink do not generally have smooth and planar surfaces a relatively wide and irregular gap may form between the surfaces of the microelectronic component and heat sink. This gap can vary in size from less than 2 mils up to 20 mils or greater. Accordingly, the interface material must be of adequate thickness to fill the gap. The use of thermal grease, paste or phase change materials cannot presently accommodate large variations in gap sizes. In general as the thickness of the interface material increases so does its thermal resistance. It is now a preferred or targeted requirement for a thermal interface material to have a total thermal resistance, inclusive of interfacial contact thermal resistance, in a range not exceeding about 0.03° C.-in$^2$/W at an applied clamping pressure of less than 100 psi and preferably less than about 20 psi.

SUMMARY OF THE INVENTION

A thermal interface assembly has been discovered in accordance with the present invention comprising a thermal interface material consisting of a material having at least one layer of a low melting alloy composition having phase change properties in combination with a sealing member selected from the group consisting of an o-ring and/or a shim for placement between a microelectronic component package and a heat sink in an arrangement such that the sealing member surrounds the thermal interface material to form a sealed thermal interface assembly possessing low contact interfacial thermal resistance when the microelectronic component package is operational.

The present invention further includes a method for forming a thermal interface between a microelectronic component package and a heat sink comprising the steps of interposing a thermal interface assembly between said microelectronic component package and heat sink comprising a thermal interface material having phase change properties and a sealing member selected from the group consisting of an o-ring and/or a shim in an arrangement with the sealing member surrounding the thermal interface material such that the thermal interface material is shielded from the atmosphere when the microelectronic component package is operational.

The thermal interface material may consist of a single material element preferably in the form of a foil possessing a thickness of from 0.0001 to 0.050 inches, and more preferably of a thickness of less than about 2 mils, and a composition consisting essentially of a low melting alloy having phase change properties or a multi-layer material structure having two or more layers, each of high thermal conductivity with at least one of the layers consisting essentially of a low melting alloy having phase change properties and with the other layer(s) representing a carrier layer(s) preferably of metal composition. High thermal conductivity for purposes of the present invention shall mean a thermal conductivity of above at least 10 W/m-K. The preferred class of high thermal conductivity metal carrier layer(s) should be selected from the transition elements of row 4 in the periodic table in addition to magnesium and aluminum from row 3 and alloys thereof.

The preferred multi-layer material structure for the thermal interface assembly of the present invention comprises three layers having an intermediate solid core of a high thermal conductivity metal or metal alloy and a layer on each opposite side thereof composed of a material having phase change properties. A material having phase change properties shall mean for purposes of the present invention a low melting metal or metal alloy composition having a melting temperature between 40° C. and 160° C. The preferred low melting material alloy of the present invention should be selected from the group of elements consisting of indium, bismuth, tin, lead, cadmium, gallium, zinc, silver and combinations thereof. An optimum low melting alloy composition of the present invention comprises at least between 10 wt %-80 wt % indium and 20 wt %-50 wt % bismuth with the remainder, if any, selected from the above identified group of elements.

BRIEF DESCRIPTION OF THE DRAWINGS

Other advantages of the present invention will become apparent from the following detailed description of the invention when read in conjunction with the accompanying drawings of which.

DETAILED DESCRIPTION OF THE INVENTION

Figure 2:
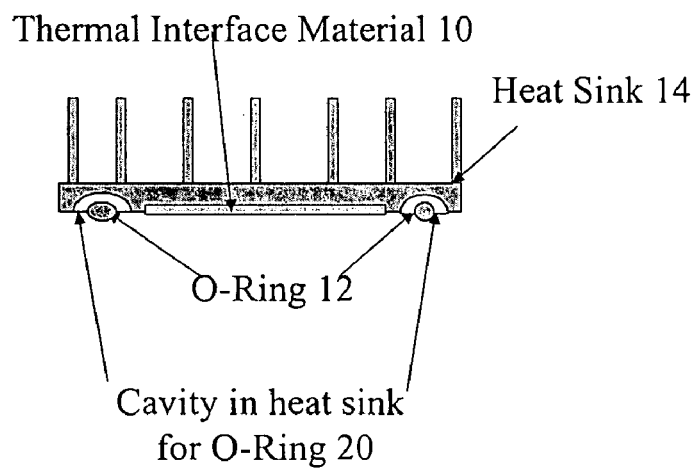
FIG. 2 is a cross sectional view of another embodiment of the thermal assembly of the present invention.
Figure 3:
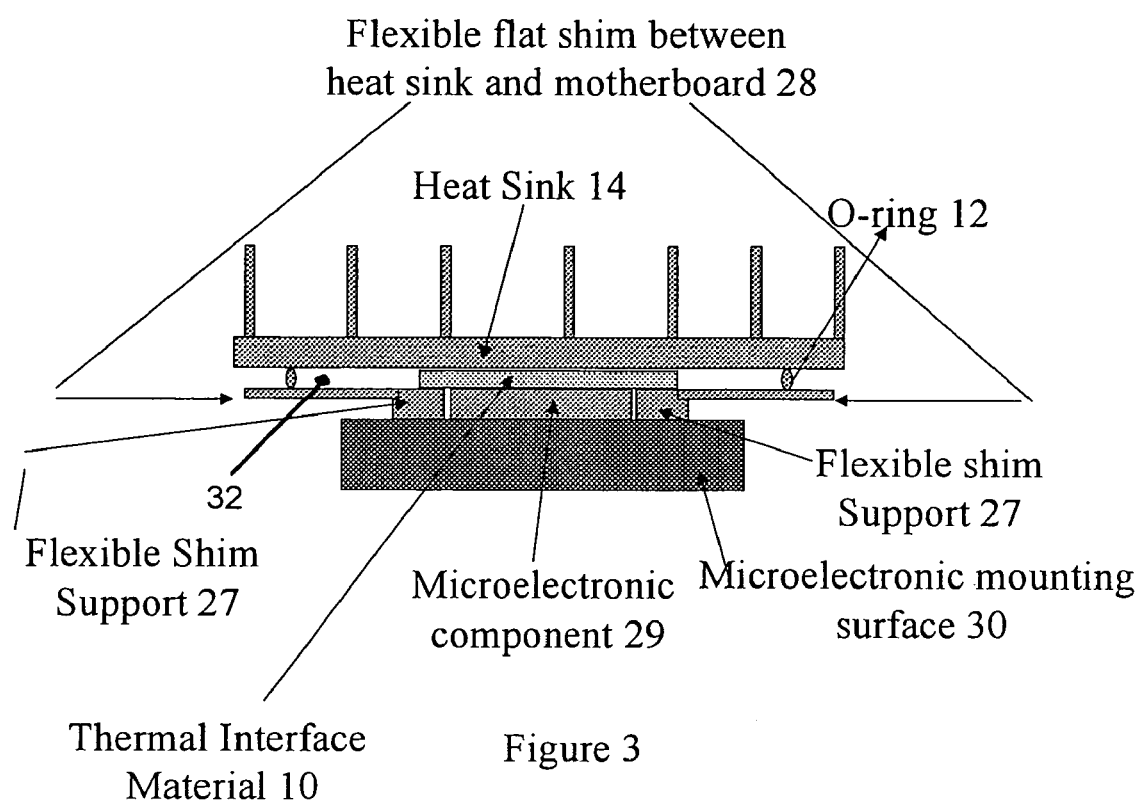
FIG. 3 is a cross sectional view of yet another embodiment of the thermal assembly of the present invention shown disposed between a conventional heat sink and, a conventional microelectronics mounting surface using both a flexible shim in addition to an o-ring for shielding the thermal interface material from the atmosphere.

The thermal interface assembly of the present invention comprises a thermal interface material 10 and a sealing member 12 adapted for placement between a heat sink 14 and a microelectronic component package 16 in an arrangement such that the sealing member 12 surrounds the thermal interface material 10 leaving an open space 32 as shown in FIG. 3. The sealing member 12 forms a seal for isolating the thermal interface material from the atmosphere, as is shown in FIGS. 1-3 respectively, when the microelectronic component package 16 is operational, i.e., when electrical power is applied across the microelectronic component package 16 such that the temperature of the microelectronic component package 16 rises above room temperature.

The thermal interface material 10 may consist of a single element preferably in the form of a foil or a multi-layer material structure with at least one layer composed of a low melting metal or metal alloy composition (hereinafter "LMA") having phase change properties and having at least one other layer composed of a high thermal conductivity material. The LMA alloy is characterized by a viscosity which is responsive to temperature such that the LMA alloy composition will be solid at room temperature but will soften i.e., begin to melt as the temperature rises above room temperature. The LMA layer should possess a thickness of from 0.0001 to 0.050 inches with a preferred thickness of less than about 2 mils. For purposes of the present invention, an LMA alloy composition should have a melting temperature of less than 157° C. and should preferably be of a composition selected from the group of elements consisting of indium, bismuth, tin, lead, cadmium, gallium, zinc, silver and combinations thereof. An optimum LMA alloy composition of the present invention comprises at least between 10 wt %-80 wt % indium and 20 wt %-50 wt % bismuth with the remainder, if any, selected from the above identified group of elements. An example of one suitable LMA alloy composition would comprise indium at 51 wt %, tin at 16.5 wt % and bismuth of about 32.5 wt %. This composition melts at approximately 61° C.

It was discovered in accordance with the present invention that the LMA alloy composition is susceptible to oxidation in the presence of air and that oxidation of the LMA alloy reduces its thermal conductivity and diminishes its thermal performance. It has further been discovered that such oxidation can be prevented by surrounding the thermal interface material 10 with a sealing member 12 to shield the thermal interface material 10 from the atmosphere when the microelectronic component package 16 is operational. It should be understood that the sealing member 12 does not necessarily have to form a completely hermetic seal. Accordingly, the sealing member 12 may be composed of any material composition which will not readily transmit air or oxygen to the thermal interface material 10. As such, the sealing member 12 may allow a relatively slow diffusion of air or oxygen. In the latter case, the rate of oxidation of the thermal interface member 10 will still be significantly slowed down after the microelectronic component package 16 becomes operational relative to the rate of oxidation of the thermal interface member 10 without the use of the sealing member 12.

Figure 1:
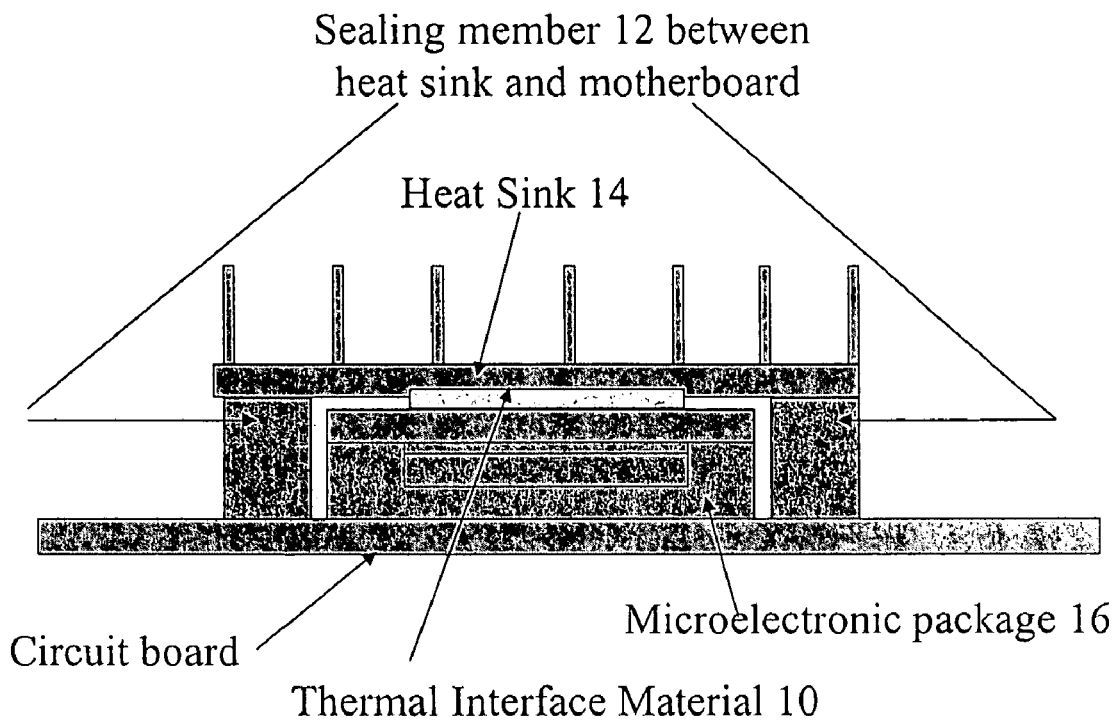
FIG. 1 is a cross sectional view showing one embodiment of the thermal assembly of the present invention disposed between a conventional heat sink and a conventional cpu microelectronics package.

The sealing member 12, as shown in FIG. 1, may be composed of any soft, pliable, compliant organic material and may be represented by an O-ring or a shim or a combination thereof which will effectively seal off the thermal interface material 10 from a continuous supply of fresh air from the atmosphere when interposed between a heat source and heat sink and can be a pre-formed sealing member or a "form-in-place" sealing material. An example of an acceptable preformed sealing material would be a soft silicone rubber gel such as "Silguard 527" a trademark product of the Dow Corning Corporation.

FIG. 2 is an alternative embodiment of the present invention in which the sealing member 12 is composed of an O-ring seated in a cavity or groove 20 formed in the heat sink 14. The design, size and composition of the O-ring should be such that the O-ring will be squeezed down approaching a thickness at least as thin as the bond-line of the LMA alloy after squeeze-out when the microelectronic component package 16 is operational, in order to minimize thermal resistance. It should be understood that it is customary for the heat sink 14 to be clamped to the cpu package 16. The clamping pressure further causes the O-ring to seal off the area between the base of the heat sink 14 and the opposing surface (which may be the lid) of the cpu package 16. Although the use of a cavity or groove 20 formed in the heat sink 14, as is shown in FIG. 2, is optional it is preferred since it accommodates the placement of the O-ring and assures that the O-ring will squeeze down to minimize bond-line thickness. In this way the sealing member 12 is forced into compression to seal off the space between the mated surfaces of the cpu package 16 and the heat sink 14.

An alternative embodiment using both a shim and O-ring for shielding the thermal interface material 10 from the atmosphere when placed between a conventional heat source and heat sink is shown in FIG. 3. This embodiment of the invention is preferably intended for a heat source having a conventional microelectronics mounting surface 30 which supports a conventional microelectronics component 29. In this embodiment the flexible shim comprises a flexible shim support 27 and a flat flexible shim section 28 extending outwardly from the shim support 27. The flexible shim support 27 has a donut-like configuration with an opening 31 which permits mounting the flexible shim support 27 about the microelectronics component 29. The flat flexible shim section 28 extends outwardly from the shim support 27 to form a support platform for mounting an O-ring 12 between the heat sink 14 and the flat flexible shim section 28.

Figure 4:
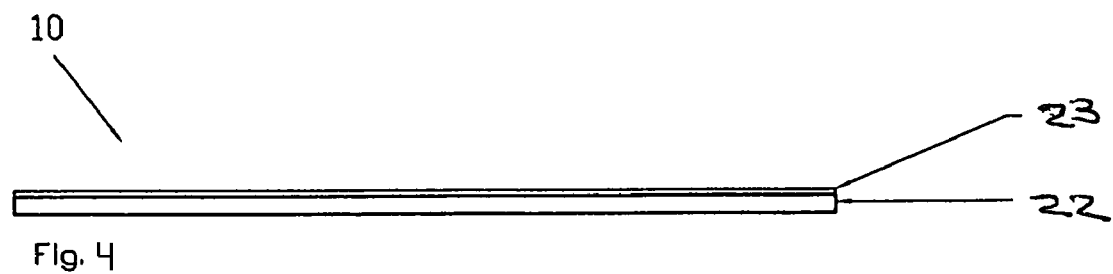
FIG. 4 is a cross sectional view of a two layer thermal interface material in accordance with the present invention with one layer having phase change properties.
Figure 5:
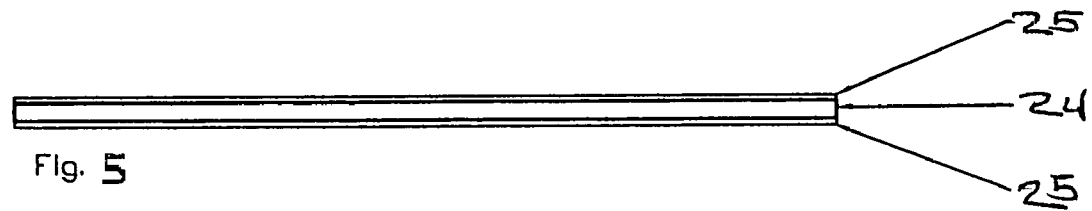
FIG. 5 is a cross sectional view of a three layer thermal interface material in accordance with the present invention having two opposing layers with phase change properties on opposite sides of a metallic core.

As explained above the thermal interface material 10 may include one or more additional layers of high thermal conductivity. Any metallic high thermal conductivity material may be used having a thermal conductivity of above at least 10 W/m-K inclusive of any of the transition elements of row 4 in the periodic table in addition to magnesium and aluminum of row 3 and their alloys. However, a foil sheet of either aluminum or copper as the carrier layer is preferred. FIG. 4 shows a thermal interface material 10 formed of a two layer metallic structure consisting of a solid metal or metal alloy sheet 22 of high thermal conductivity, designated a carrier layer, and a superimposed low melting alloy sheet 23 possessing phase change properties. An alternative and preferred three layer arrangement is shown in cross section in FIG. 5 consisting of an intermediate carrier layer 24 equivalent in composition to the carrier layer 22 of FIG. 4 and two opposing layers 25 of a low melting alloy equivalent in composition to the low melting alloy layer 23. The low melting alloy layers 23 or 25 may be laminated over the entire planar surface of the high thermal conductivity layered sheets 22 and 24 respectively or may be laminated over less than the entire planar surface of the high thermal conductivity layered sheets 22 and 24 leaving an exposed border (not shown) of any desired geometry.

What we claim is:

1. A thermal interface assembly for forming a thermal interface between a microelectronic component package and a heat sink such that under the application of pressure the thermal interface assembly has a total thermal resistance of no greater than about 0.03 ° C.-in$^2$/W comprising, in combination, a thermal interface material consisting of a structure which is solid at room temperature and includes at least three metallic layers comprising an intermediate solid core of a high thermal conductivity metal or metal alloy which remain solid when the microelectronic component package is operational and a layer on each opposite side thereof composed of a metallic alloy having phase change properties consisting of between 10 wt %-80 wt % indium and the remainder selected from the group of metallic elements consisting of bismuth, tin, lead, cadmium, gallium, zinc, silver and combinations thereof such that at room temperature said metallic alloy layer is a solid but at a temperature corresponding to when the microelectronic component package is operational the metallic alloy layer undergoes a liquid phase change and further including a sealing member having a circular configuration in cross section spaced apart from said thermal interface material to provide an open space there-between with said sealing member being composed of a compressible material selected from the group consisting of a soft, compliant o-ring and/ or shim with said open space being of sufficient size so that said open space remains after the sealing member is compressed in response to said pressure and with the sealing member being exposed to the atmosphere for forming a seal to prevent the ingress of air from the atmosphere into said open space in contact with said thermal interface material when the microelectronic component package is operational.

2. A thermal interface assembly as defined in claim 1 wherein said material having phase change properties has a thickness of less than about 5 mils.

3. A thermal interface assembly as defined in claim 2 wherein said high thermal conductivity metal or metal alloy is selected from the transition elements of row 4 in the periodic table in addition to magnesium and aluminum from row 3 of the periodic table and alloys thereof.

4. A thermal interface assembly as defined in claim 3 wherein said material having phase change properties is a low melting metal alloy.

5. A thermal interface assembly as defined in claim 4 wherein said low melting metal alloy layer comprises in addition to indium at least between 20 wt %-50 wt % bismuth.

6. A thermal interface assembly as defined in claim 5 wherein the thickness of the low melting metal alloy layer having phase change properties is less than about 2 mils.

7. A thermal interface assembly as defined in claim 2 wherein said shim comprises a flexible shim support and a flat flexible shim section extending outwardly from the shim support for forming a platform for mounting of the O-ring.

8. A method for forming a thermal interface having a total thermal resistance of no greater than about 0.03° C.-in$^2$/W between a microelectronic component package and a heat sink when held together under the application of pressure comprising the steps of interposing a thermal interface material consisting of a structure which is solid at room temperature and includes at least three metallic layers comprising an intermediate solid core of a high thermal conductivity metal or metal alloy which remain solid when the microelectronic component package is operational and a layer on each opposite side thereof composed of a metallic alloy having phase change properties consisting of between 10 wt %-80 wt % indium and the remainder selected from the group of metallic elements consisting of bismuth, tin, lead, cadmium, gallium, zinc, silver and combinations thereof such that at room temperature said metallic alloy layer is a solid but at a temperature corresponding to when the microelectronic component package is operational the metallic alloy layer undergoes a liquid phase change with the thermal interface material being disposed between said microelectronic component package and heat sink to form a thermal interface there-between and surrounding the thermal interface material with a soft compressible sealing member composed of a compressible material selected from the group consisting of a soft, compliant o-ring and/or shim having a circular configuration in cross section of sufficient dimension to form an open space there-between which remains an open space after the sealing member is compressed in response to said pressure and with the sealing member being exposed to the atmosphere for forming a seal to prevent the ingress of air from the atmosphere into said open space in contact with the thermal interface material when the microelectronic component package is operational.

* * * * *